United States Patent [19]

Nishioka et al.

[11] 4,092,602
[45] May 30, 1978

[54] AUTOMATIC FREQUENCY CONTROL FOR FM-RECEIVER

[75] Inventors: Yuji Nishioka, Takatsuki; Tetsuya Tokyama, Higashi-Osaka; Toshiyuki Takei, Hirakata, all of Japan

[73] Assignee: Onkyo Kabushiki Kaisha, Osaka, Japan

[21] Appl. No.: 691,868

[22] Filed: Jun. 1, 1976

[30] Foreign Application Priority Data

Jun. 2, 1975 Japan.................................. 50-66792

[51] Int. Cl.² .............................................. H04B 1/16
[52] U.S. Cl. .................................... 325/346; 325/421; 325/423
[58] Field of Search ............................. 325/419–423, 325/346, 349; 331/14; 179/15 BT

[56] References Cited

U.S. PATENT DOCUMENTS

| 3,297,965 | 1/1967 | Chadima | 331/14 |
| 3,686,574 | 8/1972 | Niman | 325/421 |
| 3,873,923 | 3/1975 | Iten et al. | 325/346 |
| 3,965,423 | 6/1976 | Fish, Jr. et al. | 325/346 |
| 4,006,429 | 2/1977 | Talbot | 331/14 |

*Primary Examiner*—Robert L. Griffin
*Assistant Examiner*—Jin F. Ng
*Attorney, Agent, or Firm*—Edwin E. Greigg

[57] ABSTRACT

An apparatus for comparing frequency of an object signal with a given reference frequency, with a reference signal generator for developing a reference signal having the reference frequency. If the object signal is frequency-modulated, then its center frequency is compared with the reference frequency. A switching signal generator, switching circuitry actuated by the switching signal, a frequency discriminator, low-pass filters and a voltage comparator are also provided. Actuated by the switching signal, the discriminator alternately discriminates the frequencies of the object and reference signals, and the averaged discrimination output voltages are compared by the comparator to give the indication of comparison of the frequencies of the object and reference signals.

1 Claim, 14 Drawing Figures

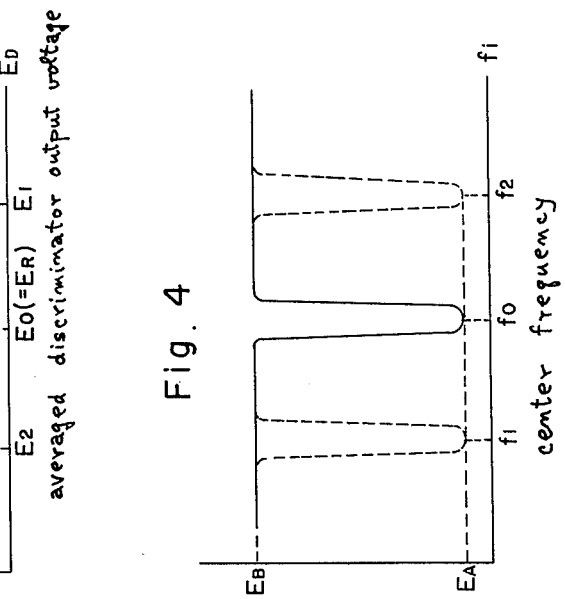
Fig. 3
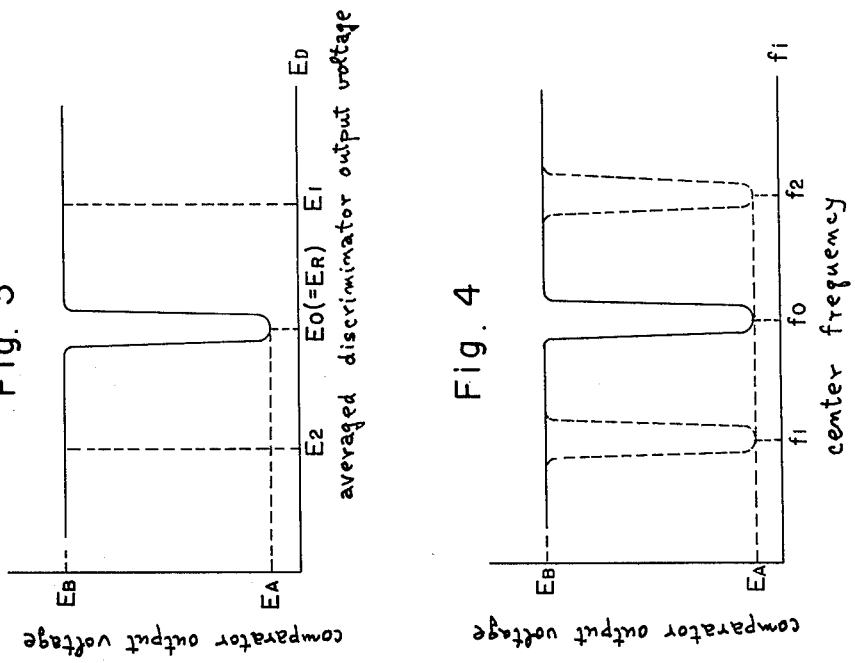
Fig. 4
Fig. 1 (PRIOR ART)
Fig. 2
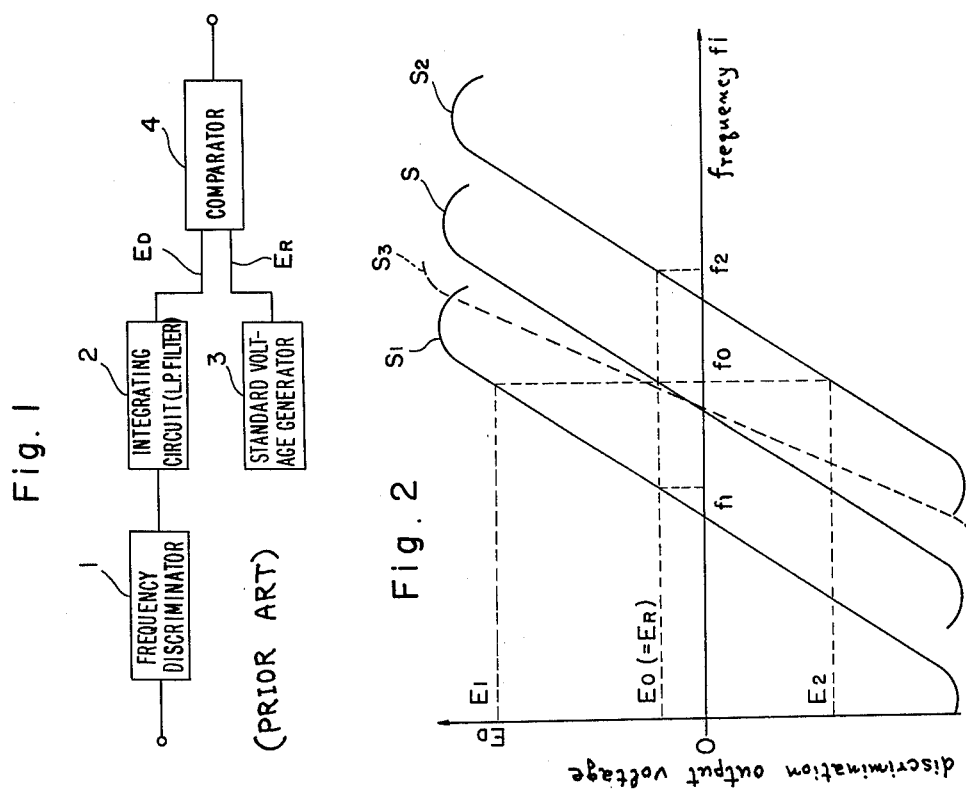

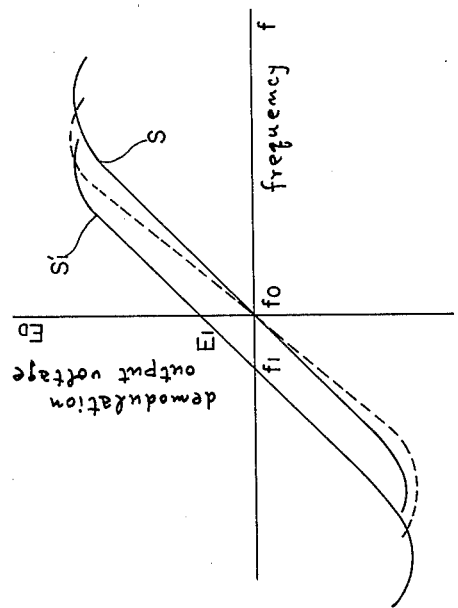
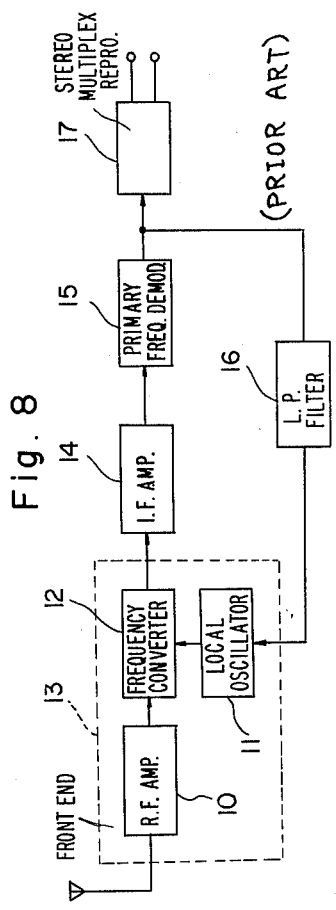
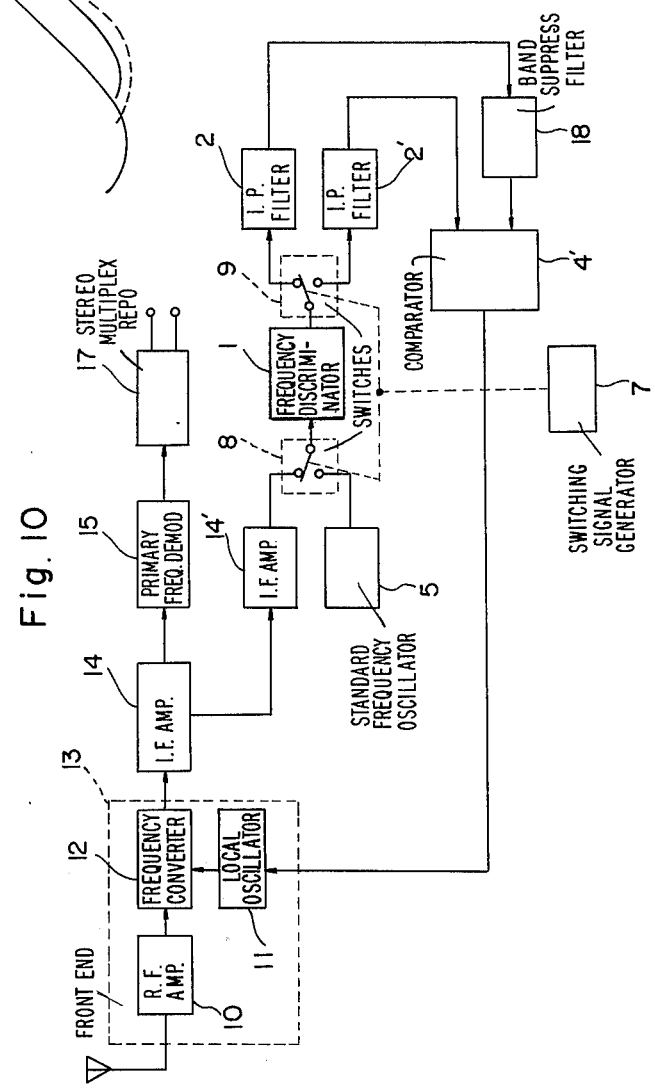

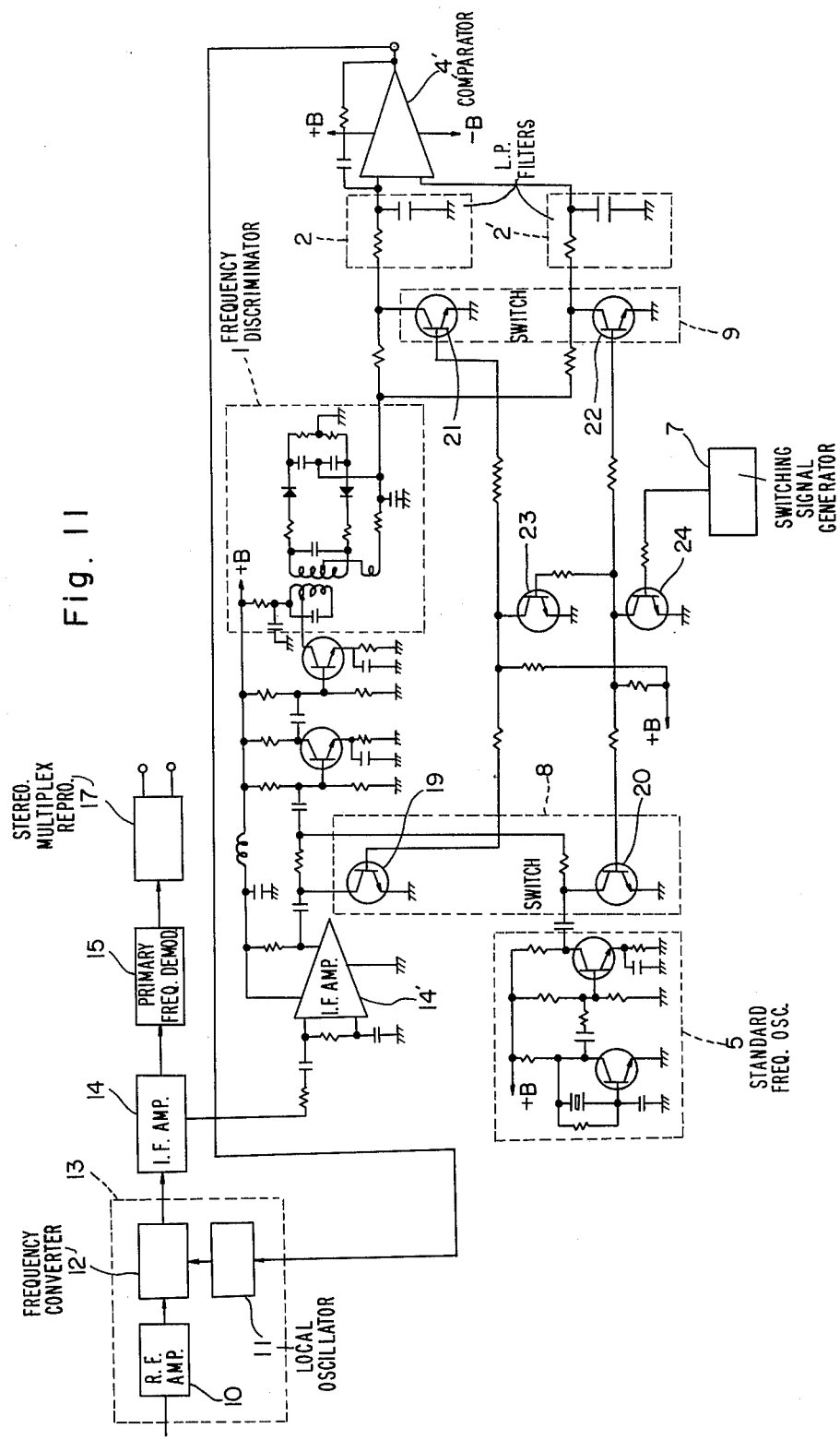

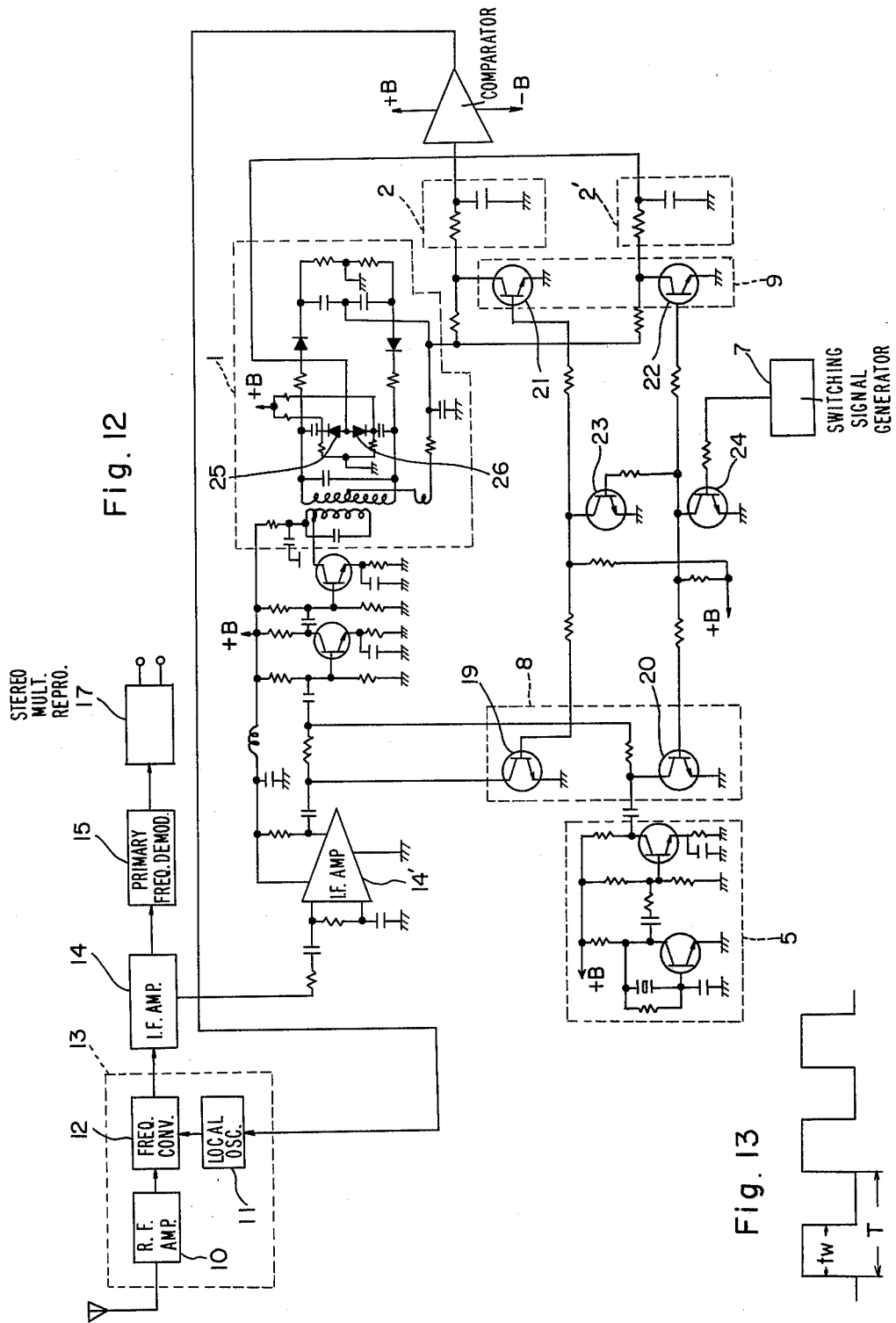

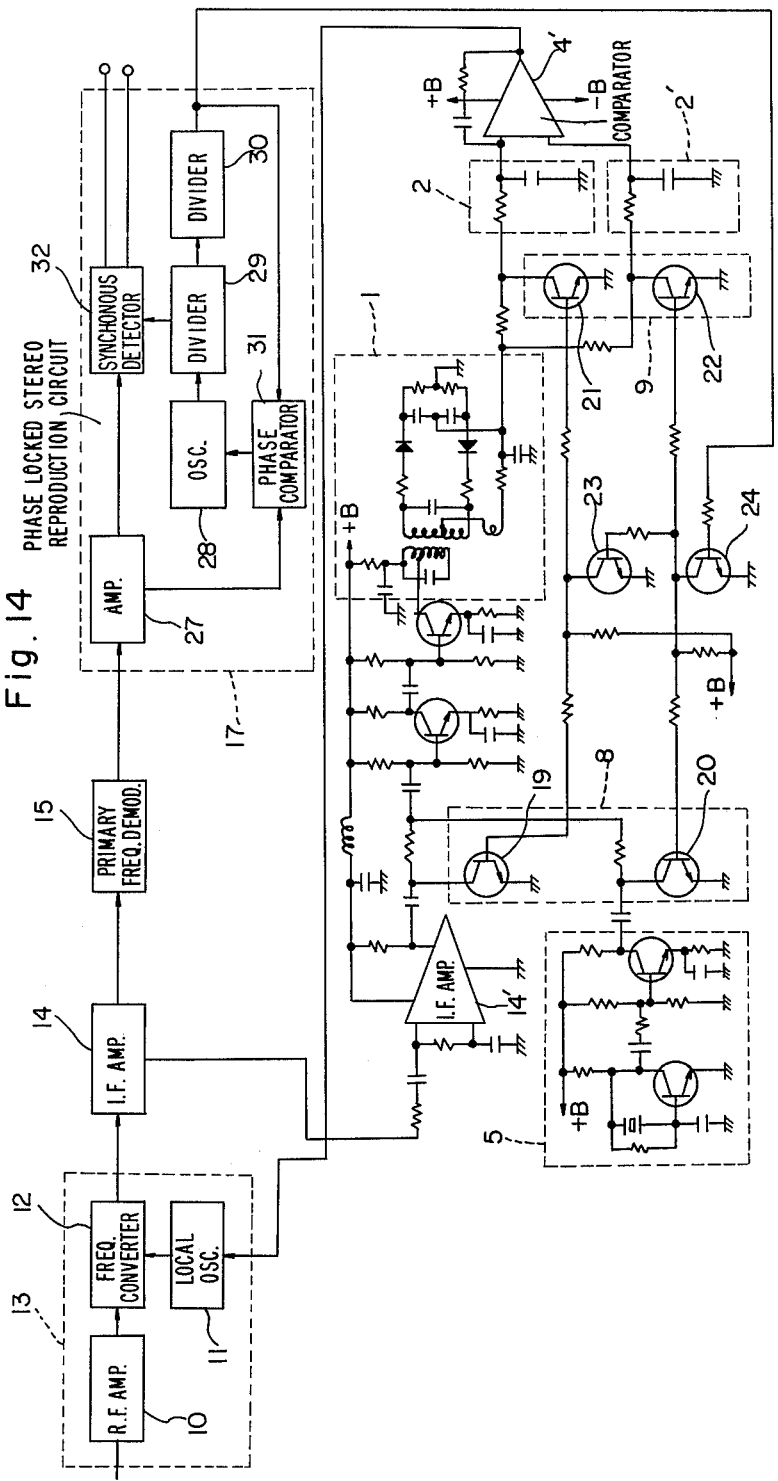
Fig. 14 PHASE LOCKED STEREO REPRODUCTION CIRCUIT

AUTOMATIC FREQUENCY CONTROL FOR FM-RECEIVER

BACKGROUND OF THE INVENTION

1. Field of the Invention

This invention relates to an apparatus for comparing frequency of an object signal, including the case of a frequency-modulated signal where the frequency is understood to be center, i.e., mean frequency of such signal; with a certain frequency.

2. Description of the Prior Art

For such comparing, it is conventional to use a frequency discriminator with calibrated chart or diagram showing the relation between the input signal frequency and the output voltage, low-pass filter or integrating circuit in case the object signal is frequency-modulated requiring averaging the discriminator output, a standard voltage generator for providing the voltage smae as the discriminator output corresponding to the said certain frequency according to the relation as given as above, and a comparator for comparing the averaged discriminator output voltage for the object signal with this standard voltage. The standard voltage generator may as well be constructed with a stable-frequency oscilator incorporating a crystal of the resonance frequency identical with said predetermined frequency and a discriminator with the same characteristics of frequency to output relation just as the discriminator already mentioned.

However, such apparatus has the fundamental defect in that the frequency to output voltage relation of the discriminator is not constant but may fluctuate in non-negligible manner as the temperature or humidity varies and/or even simply as the time lapses, of course in non-uniform manner one discriminator with another, and that the result of comparison is inevitably inaccurate because of such fluctuation.

SUMMARY OF THE INVENTION

The present invention aims to eliminate this defect and to provide a practical comparing apparatus of the type described above with very high accuracy insusceptible of the variation of temperature and/or humidity and stable practically for infinite length of time.

For attaining this aim, the comparing apparatus according to the present invention comprises: means for developing a reference signal having the said certain frequency; means for developing a switching signal; a frequency discriminator; means for connecting the discriminator alternately to the object signal and the reference signal synchronously with the switching signal; means for switching over the discrimination output also synchronously with the switching signal, thus for deriving separate discrimination outputs of the object signal and the reference signal, respectively; means for deriving, from the discrimination outputs, average discrimination output voltages of the object signal and the reference signal, respectively; and comparator means for comparing these two discrimination output voltages.

With this construction, the effect of any possible fluctuation in the characteristics of the discriminator will appear just identically both in the average discrimination output voltage of the object signal and that of the reference signal, so long as the said fluctuation is practically kept in a constant level for the short period of time of each one cycle of the switching signal, and will thus be compensated practically perfectly by the comparator means.

This comparing apparatus may very preferably be utilized in a receiver which is for frequency-modulation system and which comprises a frequency convertor with a local oscilator for converting the carrier into a heterodyned intermediate frequency whose center, i.e., mean value is desired to keep exactly a frequency, an intermediate frequency amplifier and a frequency demodulator; in the purpose of automatically keeping the intermediate frequency to the exact value as desired.

For clear selection of the transmitted signal and for reproduction of the audio signals, it is vitally important to keep the intermediate frequency to the exact value as desired.

For the purpose of such automatic control of the intermediate frequency, it has been conventional in the receiver of the type mentioned above, to incorporate a variable capacitance diode in the local oscilator resonsance circuit and a low-pass filter or integrating circuit to receive as its input the output of said frequency-demodulator and to give as its output a regulation voltage to actuate the variable capacitance diode.

Such automatic frequency control will be sufficient if the frequency-demodulator retains its proper resonance characteristics, namely always to give zero low-passed or averaged regulation voltage when the actual intermediate frequency has the center or mean value exactly same as the value as desired. However, the frequency-demodulator is essentially of the same type as the discriminator already mentioned, and the resonance characteristics are thus apt to fluctuate just similarly as also mentioned already, and such fluctuation will lead to undesirable deviation of the regulated intermediate frequency.

For elimination of such fluctuation of the intermediate frequency, the frequency comparing apparatus according to the present invention, with the comparator means constructed here as a subtractor, may be incorporated in the receiver of the type described above and the output of the subtractor is given to the variable capacitance diode provided in the local oscilator circuit thus to establish the automatic frequency control known per se. The intermediate frequency will according to this construction be quite effectively regulated to constantly same as the frequency of the said stable reference signal.

When the intermediate frequency is retained to be same as that of the reference signal as mentioned just above, the discriminator should preferably be working with the resonance frequency also exactly same as that, namely with the center of the "S-curve", as commonly so referred to, coinciding with that frequency thus giving zero output voltage at that frequency, since the center of the S-curve is generally the center of symmetry and the regulation according to the present invention works perfectly in such condition, though the irregularities due to non-symmentry when worked off such center of the S-curve is normally very small as may practically be of rather minor importance.

For realizing such preferable condition, the comparing apparatus according to the present invention, with omission of the comparator means, may be incorporated in the receiver of the type described above; with further provision of feedback means of the average discriminator output voltage of the reference signal to the discriminator for compensation of any possible deviation of the resonance characteristics of the discriminator, and automatic frequency control means to regulate the local oscilator by means of the average discrimination output voltage of the actual intermediate frequency. Those skilled in the art will immediately recognize the function as mentioned above, without requiring any further explanation.

Fundamental principle of the present invention as outlined above is based on the supposition that the said switching signal will alternately change over the connection of the discriminator in perfectly balanced manner as to the actuating time intervals for the object signal and for the reference signal. This condition is generally satisfied to the sufficient extent, since conventional switching-signal-generator means will normally give the signal with the duty cycle sufficiently near 50%. In view, however, that the receiver of the type described above is recently for stereophonic broadcast utilizing a transmitted signal comprising a carrier frequency-modulated by the so-called composite signal as is reproduced by the frequency demodulator, and quite often uses a circuitry for generating sub-carrier perfectly in phase with the pilot signal and that a switching signal with the duty cycle exactly equal to 50% can quite easily be derived from such circuitry, it is preferred to incorporate the comparing apparatus according to the present invention, with the comparator means constructed here as a subtractor, in the receiver of such type, namely with sub-carrier generating means with automatic regulation for realizing the sub-carrier perfectly in phase with the pilot signal by the regulation from comparison of phase between the pilot signal and a signal frequency-divided from oscilation output of an oscilator for frequency or phase variable in response to regulation voltage, and to give the output of the subtractor to the variable capacitance diode provided in the local oscillator circuit thus to establish the automatic frequency control known per se.

BRIEF DESCRIPTION OF THE DRAWINGS

FIG. 1 is a block diagram showing the conventional apparatus for comparing the frequency of an object signal with a predetermined frequency value;

FIG. 2 shows diagrammatically the output characteristics of a frequency discriminator and how the error may be derived from drift of such characteristics;

FIG. 3 is a chart showing how the comparator output voltage of such comparing apparatus will change in response to the frequency discriminator output voltage;

FIG. 4 is the similar chart showing how the comparator output voltage of such comparing apparatus will change, but here in response to the center frequency of the object signal;

FIG. 8 is a block diagram of a receiver for a sterophonic frequency-modulation system with conventional automatic frequency control;

FIG. 9 shows diagrammatically the output characteristics of a frequency discriminator and how the intermediate frequency may fluctuate in such conventional control in response to drift of such characteristics;

FIG. 10 is a block diagram of a receiver for a sterophonic frequency-modulation system with automatic frequency control incorporating the comparing apparatus according to the present invention;

FIGS. 11 and 12 are schematic representation of two different embodiments of the control circuitry used in FIG. 10, more specifically illustrating the component parts;

FIG. 13 is a schematic diagram of a switching signal to be used in the present invention; and FIG. 14 is a schematic representation of another embodiment of the control circuitry incorporating the comparing apparatus according to the present invention, realizing the switching signal of the perfectly desirable form.

DESCRIPTION OF THE PREFERRED EMBODIMENTS

Figure 5:
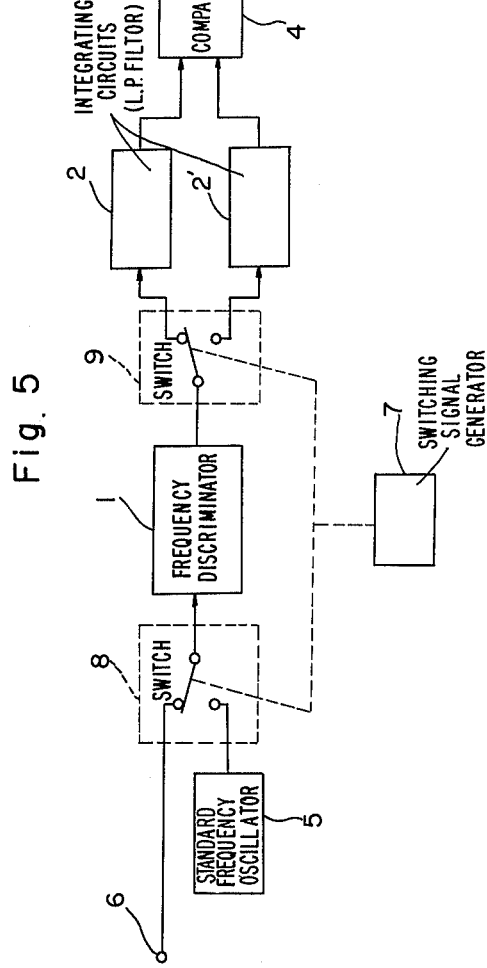
FIG. 5 is a block diagram of the comparing apparatus according to the present invention.

How the present invention is performed is now described with reference to the drawings.

Referring first to FIG. 1, the conventional system as represented by this block diagram for comparing the frequency of an object signal, which means center, i. e., mean frequency if the signal is frequency-modulated, with a predetermined frequency; is to give the object signal as input to a frequency discriminator 1 with calibrated chart or diagram of the relation between its input signal frequency and its output voltage, which output voltage is given to a low-pass filter or integrating circuit 2 in case the object signal is frequency-modulated, to derive thereby an averaged output voltage $E_D$. On the other hand, a standard voltage generator 3 is provided to derive a standard voltage $E_R$ which is same as the discriminator output corresponding to the said predetermined frequency according to the relation as per the said calibrated chart. Intended comparison of the frequency is thus done by comparing the output voltages $E_D$ and $E_R$ by a comparator 4. The standard voltage generator 3 may be constructed with a stable-frequency oscilator incorporating a crystal of the resonance frequency identical with said predetermined frequency and a discriminator with the same characteristics of frequency to output relation just same as the discriminator 1.

However, accurate comparison can not be expected with such system, since the characteristics of frequency to output relation of the discriminator 1 as well as of another discriminator as might be incorporated in the generator 3 as mentioned above may drift as the temperature or humidity varies and/or even simply as the time lapses, of course in non-uniform manner one discriminator with the other.

Assuming that the standard voltage $E_R$ is fixed, that the initial "S-curve", i.e. the chart of the relation between the discrimination output voltage $E_D$ and the frequency $f_i$ of the object signal, is represented by curve S in FIG. 2, that the said standard voltage $E_R$ corresponds to predetermined standard frequency $f_o$ according to this curve S, that the comparator 4 gives output voltage in response to the averaged discriminator output voltage $E_D$ as shown in FIG. 3, and that the said frequency $f_i$ happens to be $f_o$; the initial discriminator output voltage $E_D$ will be $E_o$ as shown in FIG. 2 and the output voltage of the comparator 4 will then be $E_A$ as seen in FIG. 3, i.e. the low level, which is thus to indicate that the frequency $f_i$ of the object signal coinsides with the predetermined frequency $f_o$.

However, the S-curve may drive from said initial curve S, as mentioned already, for instance to curve $S_1$, $S_2$ or $S_3$ in FIG. 2. If it drives to curve $S_1$, then the same object signal of the frequency $f_o$ will give the discriminator output voltage $E_D$ at the value $E_1$ as seen in FIG. 2, and the comparator 4 will thus give the output voltage $E_B$ as seen in FIG. 3, i.e. the high level, thus indicating, erroneously, as if the frequency $f_i$ were different from the predetermined frequency $f_o$, though in fact $f_i = f_o$ in this instance. With such drifted curve $S_1$, the comparator 4 will give the low level $E_A$, thus indicating as if the frequency $f_i$ coincided with the predetermined frequency $f_o$, when in fact $f_i = f_1$ thus $f_i \neq f_o$. It is seen therefore, that the frequency error of $(f_1 - f_o)$ will result in this comparing apparatus from such drift as above. Similarly, frequency error of $(f_2 - f_o)$ will result from drift of the initial curve S to curve $S_2$. Though the curves $S_1$ and $S_2$ are shown as if they are parallel with the curve S, drift with variation in the slope of the curve, for instance from curve S to $S_3$, may in some case be also seen.

The effect of such error is practically very serious. The discriminator 1 is normally constructed with coils and capacitors, for instance such circuitry known as "ratio detector". Said drift of the S-curve will in such case result mainly from fluctuation of the inductance and capacitance values under fluctuation of temperature and humidity among other, thus of the resonance frequency of the circuitry. For instance, inductance value of the coil will have positive temperature coefficient (normally in the range of 220±60 ppm/° C), while capacitance value of the distributed capacitance of the coil winding and of the capacitor will have negative temperature coefficient (normally in the range of −220±60 ppm/° C). Such temperature coefficients will vary in nonuniform manner one individual element with another, and all these values will also drift even simply as the time lapses. Thus, compensation of fluctuation of the overall resonance characteristics under the temperature variation might anyhow be possible when particular elaborate care be individually taken for each specific resonance circuitry, but there in fact are no general means as might practically be applied in the mass-production system.

Conventional way for minimizing the fluctuation has thus been practically only to use the parts of excellent quality, namely the coils and capacitors of very low temperature coefficient.

Anyway, overall drift in resonance frequency of the normal discriminator 1 under temperature fluctuation may perhaps be in the range of 100 to 150 ppm/° C. Thus, the frequency error per temperature fluctuation will be in the range of 1 to 1.6 kHz/° C if the predetermined frequency to be compared with the object signal is 10.7 MHz, namely the normal intermediate frequency of the receiver for the frequency-modulation system. If the temperature rise to be considered is 30° C, the frequency error will be in the range of 30 to 48 kHz. As for the effect of humidity, the frequency error something like 100 kHz should normally be considered for fluctuation of the humidity from 30 to 100%, and the error of about 50 kHz has been unavoidable even under very special designing of the discriminator 1 for minimizing such error. Such error varies, even with such special designing, from one discriminator 1 to another.

FIG. 5 is a block diagram of the comparing apparatus according to the present invention which will eliminate the error as described above. Here in FIG. 5, like parts are designated by like numerals as in FIG. 1, thus designated at 1, 2 and 4 are frequency discriminator, low-pass filter and comparator, respectively, while another low-pass filter 2' is here inserted before the comparator 4 in the line for the standard voltage $E_R$. Instead of the standard voltage generator 3 shown in FIG. 1, designated at 5 in FIG. 5 is a standard frequency oscillator for instance incorporating a crystal of the resonance frequency identical with the predetermined frequency $f_o$. Though the frequency $f_o$ of the oscillator 5 is thus normally supposed to be stable and constant, it may as well undergo fluctuation and then the term "standard" should more properly be understood as "reference". Anyway, the object signal to be compared with said reference signal is fed to terminal 6. A switching-signal-generator 7 is provided for developing a switching signal of a suitable frequency, which actuates simultaneously the switching-over of a pair of switching means 8 and 9. Thus the discriminator 1 is connected alternately to constitute the passageway therethrough on one hand from the input terminal 6 for the object signal to the comparator 4 and on the other hand from the reference frequency oscillator 5 to the comparator 4, in synchronization with the switching signal. Low-pass filters 2 and 2' are supposed to be of identical construction with each other.

Figure 6:
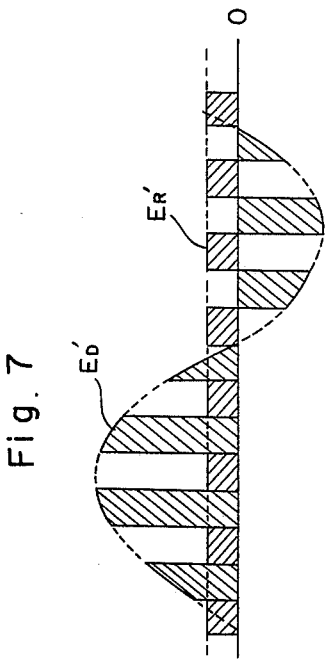
FIGS. 6 and 7 are schematic charts showing how the frequency discriminator outputs will change as the time proceeds.

Supposing here the instance where the resonance frequency of the discriminator 1 coincides with the reference frequency $f_o$ and the center or mean frequency of the object signal also coincides therewith, then the discrimination output voltages for the object and reference signals, $E_D'$ and $E_R'$, respectively, will be as shown in FIG. 6 with abscissa thereof representing the time lapse, if the object signal is frequency-modulated in a sinusoidal way. Coming out through the low-pass filters 2 and 2', the respective input voltages $E_D$ and $E_R$ for the comparator 4 will thus both be null, and the comparator 4 will give the low-level output $E_A$ just as shown in FIG. 3, thus indicating the coincidence of the center frequency of the object signal with the reference frequency $f_o$.

Figure 7:
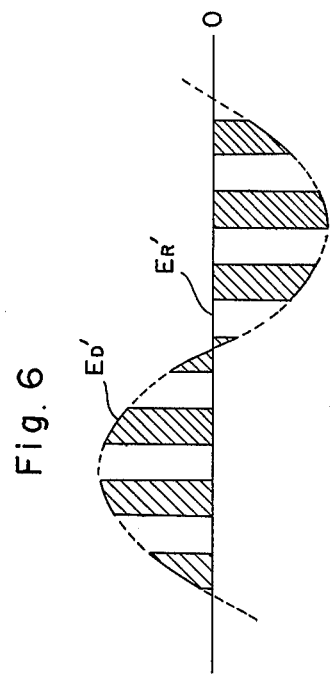

In such case, if the S-curve of the discriminator 1 undergoes drifting as described already, then the discrimination output voltages will change from those shown in said FIG. 6 to such for instance as shown in FIG. 7. In this instance, the discrimination output voltage $E_R'$ for the reference signal will be in a form of a series of rectangular waves and the averaged input voltage $E_R$ for the comparator 4 can no longer be null. In this instance, however, the discrimination output voltage $E_D'$ for the object signal will undergo just the same drift as in said $E_R'$ and therefore the drift of the averaged voltage $E_D$ is also just same as in said $E_R$. Such drifts will thus be cancelled by the comparator 4, and the frequency of the object signal can be compared with the reference frequency $f_o$ without any effect of the possible drift of the resonance characteristics of the discriminator 1.

When the reference frequency $f_o$ is given as fixed, then precision or accuracy of this comparing apparatus will thus be dependent only on the frequency stability of the oscillator 5, and when a crystal oscillator is used in this reference frequency oscillator 5, then the error in frequency-comparing will be kept within several ppm/° C. This is of the order only of one thirtieth to one tenth of the conventional error of 100 to 150 ppm/° C as mentioned before.

If a reference oscillator with variable frequency as may be readable by accurate dial indicator is available, then this apparatus shown in FIG. 5 may as well be used for measuring the center frequency of the object signal, by incorporating such oscillator as the oscilator 5 in this figure and by dialing this oscillator to see in what dial indication the comparator 4 gives the coincidence signal, namely the low level output $E_A$.

The comparing apparatus may also very preferably utilized in a receiver for the frequency-modulation system, in the purpose of automatically keeping the intermediate frequency to the exact value as desired, which is normally 10.7 MHz.

Preparatory to describing such application of the apparatus according to the present invention, brief description of the conventional system for the automatic control of the intermediate frequency of such receiver is now given with reference to FIG. 8, a block diagram in which a radio-frequency amplifier 10, a local oscillator 11 and a frequency convertor 12 constitute a unit generally referred to as a front-end 13, with further blocks of an intermediate frequency amplifier 14, primary frequency demodulator 15, a low-pass filter 16 and stero multiplex reproduction circuit 17 for reproducing two separate stereophonic audio signals which should be replaced by a simple audio amplifier when monophonic reaction is the only object.

Output of the demodulator 15 is the composite signal comprising a matrixed audio signal, stereo pilot signal and specially modulated sub-carrier signal; and the gist of the conventional automatic frequency control is to derive an averaged output voltage by passing the demodulated composite signal through a low-pass filter 16 and to feed back the averaged voltage to the local oscilator 11 for regulating the oscilator frequency thus to compensate any possible deviation of the intermediate frequency from the desired frequency $f_o$.

Referring now to FIG. 9 showing the relation between the output voltage of the demodulator 15 and the center frequency of the intermediate frequency, such conventional control will work sufficiently if the S-curve of the demodulator 15 is always kept stable as curve S in this chart, namely with its resonance frequency stably coinciding with said reference frequency $f_o$, since deviation of the actual intermediate frequency therefrom will in this instance certainly cause the averaged regulation voltage and the deviation will thus effectively be compensated by feeding back the voltage to the oscillator 11 as mentioned above.

However, the demodulator 15 is essentially of the same nature just as the discriminator 1 as described before, thus the S-curve may drift from said curve S for instance to curve S' in FIG. 9. In a manner just same as described before, such drift from curves S to S' will result in the averaged demodulation output voltage $E_1$ when the actual intermediate frequency indeed coincides with the reference frequency $f_o$, and the automatically regulated intermedite frequency can in this instance no longer be $f_o$ but drifts to $f_1$ as seen in FIG. 9. Dotted line in FIG. 9 is shown to indicate the possibility of another mode of drift of the S-curve, just as was already described with respect to curve $S_3$ in FIG. 2.

Upon the preparatory description as above, the application of the apparatus according to the present invention to the receiver of the type as described will now with reference to FIG. 10 be described, in which like parts are designated by like numerals as in FIGS. 5 and 8, with reference therefore to the frequency discriminator 1, low-pass filters 2 and 2', reference frequency oscilator 5, switching signal generator 7, switching means 8 and 9, radio-frequency amplifier 10, local oscilator 11, convertor 12, front-end 13, intermediate frequency amplifier 14, primary frequency-demodulator 15 and stereo multiplex reproduction circuit 17 which should also here be replaced by a simple audio amplifier when monophonic receiption is the only object. Designated at 4' is means for comparing the two inputs therefor, but the reference numeral is purposely distinguished from that of the comparator 4 in FIG. 5, since said means 4' is here in this instance to derive an output voltage which is essentially proportional to the difference between the two input voltages, thus this may now be understood as a subtractor 4'. Designated at 14' is a supplementary intermediate frequency amplifier, inserted in addition to the main line intermedite frequency amplifier 14. As seen, a band-suppressing filter 18 is inserted in between the low-pass filter 2 and the subtractor 4' for blocking the possible passage of the switching signal, in order to eliminate the bearing as might be feared to occur between such switching signal and any residual troubling frequency portion of the composite signal demodulated by the discriminator 1.

It will thus immediately be clear to those skilled in the art that the present system shown in FIG. 10 is to very effectively and securely retain the actual intermediate frequency to the desired frequency $f_o$, normally 10.7 MHz, without fluctuation deviating therefrom.

A practical example of the automatic regulating circuit outlined in FIG. 10 is schematically shown in FIG. 11. Supposing that the frequency of the switching signal furnished by the generator 7 is properly selected outside the audio frequency range, normally covering from 0 to 15 kHz, as demodulated by the discriminator 1; the band-suppressing filter 18 is omitted here in FIG. 11.

The reference frequency oscilator 5 will always furnish a stable frequency $f_o$, normally 10.7 MHz, as defined by a crystal incorporated therein as illustrated. Switching means 8 is here constructed with a pair of transistors 19 and 20, and switching means 9 is similarly constructed with another pair of transistors 21 and 22. Emitters of these four transistors 19–22 are all directly grounded. Both of the bases of the transistors 19 and 21 are connected together via a couple of resistors, the junction between which is directly connected to collector of a transistor 23. Just similarly, both of the bases of the transistors 20 and 22 are connected together via another couple of resistors, the junction between which is directly connected to collector of another transistor 24, whose base is connected to the switching signal generator 7 via a suitable resistor. Collector of this transistor 24 is connected to base of the transistor 23 via a suitable resistor. It is thus seen that these transistors 19–24 will work as the switching means 8 and 9, namely for switching-over synchronously with the switching signal given by the generator 7, since positive output of the generator 7 will turn on the transistor 24, thus cutting off the transistors 20, 22, 23 and turning on the transistors 19, 21, while negative output of the generator 7 will cut off the transistor 24, thus turning on the transistors 20, 22, 23 and cutting off the transistors 19, 21.

The present system outlined in FIG. 11 will thus quite securely retain the intermediate frequency to the stable reference frequency $f_o$ defined by the crystal in the oscilator 5, just as described already before. However, the middle portion of the S-curve of the discriminator 1 may in this instance drift considerably also as mentioned before, thus it may off the said desired frequency $f_o$ even though it may have initially coincided therewith. When the discriminator 1 thus operates off such center of the S-curve, then there is a fear of resulting in some irregularities due to non-symmetry of the used portion of the S-curve, though the ultimate error based thereon is normally very small as may practically be negligible. It is in anyway preferable to eliminate such irregularities, and an embodiment for realizing such aim is shown in FIG. 12 in which like parts are designated by like numerals as in FIG. 11.

In the present instance, a pair of variable capacitance diodes 25, 26 of identical characteristics are incorporated in the resonance circuit of the discriminator 1, and the output voltage of the reference signal furnished by the oscilator 5 and demodulated by this discriminator 1 is averaged by the low-pass filter 21 and is fed back to the variable capacitance diodes 25, 26 for readjusting the S-curve of the discriminator 1. It will thus be immediately clear to those skilled in the art that the discriminator 1 is regulated always to have the resonance frequency exactly equal to the stable reference frequency $f_o$ of the oscilator 5.

The actual intermediate frequency taken from the main line intermediate frequency amplifier 14 and magnified by the supplementary amplifier 14' is frequency-demodulated by the discriminator 1 regulated to keep the resonance frequency $f_o$ as mentioned just above, and so the averaged output voltage of the low-pass filter 2 corresponds in this case to the possible deviation, of the center value of the actual intermediate frequency, from the said reference frequency $f_o$, and since this averaged voltage is fed back to the local oscilator 11 for regulating the frequency generated there, the actual intermediate frequency is also effectively kept to said desired frequency $f_o$.

Prerequisite to the present invention as outlined hereinbefore is the supposition that the switching signal will alternately change over the connection of the discriminator 1 in perfectly balanced manner as to the actuating time intervals for the object signal and for the reference signal. This condition is generally satisfied to the sufficient extent by providing suitable known means as the signal generator 7, since the duty cycle, which is the ratio of the time lengths $t_w$ to T as seen in FIG. 13, of 50% can be given to the sufficient degree of approximation. In view, however, that the stereo multiplex reproduction circuit 17 is recently quite often constructed as the type generally referred to as "phase-lock-loop" and that a perfect switching signal exactly of 50% duly cycle may easily be derived from such type circuit, it is preferred, according to another feature of the present invention, to provide an embodiment as schematically shown in FIG. 14 in which like parts are designated by like numerals as in FIGS. 11 and 12. As seen, the phase-lock-loop type stereo multiplex reproduction circuit 17, known per se, is constructed with an amplifier 27, an oscilator 28, a frequency half divider 29, another frequency half divider 30, a phase comparator 31 and a synchronous detector 32. Supposing that the frequency of the stereo pilot signal is 19 kHz, thus the frequency of the sub-carrier is 38 kHz; the oscilator 28 is designed to develop by itself an oscilation output with a frequency close to 76 kHz, with possibility of regulating the frequency in a proper narrow range therearound, covering the value of 76 kHz within the range, by the regulation input voltage as given to this oscilator 28 from the phase comparator 31, as illustrated by an arrow connecting them together. The phase comparator 31 receives as its inputs on one hand the stereo pilot signal selectively taken out from the frequency-demodulated composite signal in the amplifier 27 and on the other hand a signal derived from the oscilator 28 but with the frequency equal to one quarter of the original oscilation output through the passage of the two-stage tandem dividers 29 and 30, and furnishes the regulation voltage to the oscilator 28 as mentioned already, which is proportional to the phase difference between the said two inputs for this comparator 31. This regulation voltage is to adjust the oscilator 28 in such way that the oscilation output is brought to have the frequency exactly four times as high as the stereo pilot signal, thus precisely 76 kHz, and perfectly in phase with that pilot signal. The first stage divider 29 will therefore develop the required sub-carrier signal of 38 kHz also in perfect phase with the pilot signal, and the synchronous detector 32 incorporating this sub-carrier signal and actuated thereby will thus give the two stereophonic audio outputs as is well known in the art.

As seen, the gist of the present apparatus shown in FIG. 14 is to utilize the output of the second stage divider 30 as the switching signal as described hereinbefore as furnished by the generator 7. Since this divider output is in perfect phase with the stereo pilot signal when such is present, i.e. when receiving the stereophonic broadcast, duty cycle of the switching signal perfectly equal to 50% will in this case be established as a matter of course. If receiving a monophonic broadcast, then there is no pilot signal present and thus no phase-lock-loop is established. However, the duty cycle of the switching signal will even in such case be quite sufficiently close to 50%, since the oscilator 28 will even then furnish the oscillation output of normal stability and the serial frequency dividing therefrom is to lead to effectively improving the accuracy of 50% duty cycle from one stage to another of such frequency dividing. Since the transmitted frequency range of the stereophonic audio signals is normally 0 – 15 kHz when the frequency of the stereo pilot signal is 19 kHz as mentioned above, beating therebetween, if any, must have the frequency higher than 4 kHz and such beating effect, as might anyhow appear in the input to the low-pass filter 2, will thus sufficiently be suppressed by this filter 2 and the averaged output voltage thereof will therefore be quite free from any possible minor error as might be caused by the irregularities due to such beating. There will thus be established the frequency control of very high accuracy.

We claim:

1. An automatic frequency control device for an FM-receiver of the type having a frequency convertor, an intermediate frequency amplifier and a frequency demodulator, and in which the frequency convertor is provided with a local oscillator to convert an incoming carrier into an intermediate frequency signal, said automatic frequency control device comprising:

means for developing a reference signal having a predetermined intermediate frequency ($f_o$);

means for developing a switching signal of 50% duty cycle;

a frequency discriminator;

means for connecting said discriminator alternately to said reference signal and to said intermediate frequency signal obtained from said intermediate frequency amplifier synchronously with said switching signal;

means for switching the output of said discriminator synchronously with said switching signal to obtain separate discrimination outputs of the reference signal and the intermediate frequency signal respectively;

means for deriving, from the discrimination outputs, average discrimination output voltages ($E_D$, $E_R$) of the reference signal and the intermediate frequency signal, respectively;

subtractor means connected to said discriminator outputs for obtaining the voltage difference ($E_D - E_R$) therebetween;

automatic frequency control means connected to be controlled by said difference voltage for regulating the frequency of said local oscillator;

a phase-lock-loop type stereo multiplex reproduction circuit which includes:

an amplifier connected to the output of said frequency demodulator;

an oscillator to transmit a frequency or phase change signal according to regulation voltage;

frequency divider means to divide an output signal from said oscillator;

a phase comparator to compare the phase of an output signal from said frequency divider means and the phase of the stereo pilot signal in the composite signal transmitted from said amplifier, an output from said phase comparator being connected to said oscillator to regulate the frequency or phase thereof; and a synchronous detector to reproduce two audio signals separated from the composite signal by the output signal from said frequency divider means, the output signal from said frequency divider means being further used as said switching signal.

* * * * *